United States Patent [19]

Borchert

[11] Patent Number: 4,471,452
[45] Date of Patent: Sep. 11, 1984

[54] DIGITAL TIME BASE WITH COHERENT RATE SWITCHING

[75] Inventor: Marshall B. Borchert, Aurora, Nebr.

[73] Assignee: Tektronix, Inc., Beaverton, Oreg.

[21] Appl. No.: 389,813

[22] Filed: Jun. 18, 1982

Related U.S. Application Data

[63] Continuation of Ser. No. 124,173, Feb. 25, 1980, abandoned.

[51] Int. Cl.³ .............................................. G06F 7/52
[52] U.S. Cl. .................................... 364/703; 307/271;
331/179; 364/179; 364/569; 377/47
[58] Field of Search ............... 364/179, 701, 703, 485, 364/569; 307/271; 328/15, 39, 41, 46, 48; 331/179; 340/347 SH; 377/39, 44, 47, 48, 52, 107

[56] References Cited

U.S. PATENT DOCUMENTS

| | | | |
|---|---|---|---|
| 3,550,015 | 12/1970 | Naubereit et al. | 328/48 |
| 3,659,048 | 4/1972 | Zuerblis et al. | 331/179 X |
| 3,716,794 | 2/1973 | Teggatz et al. | 328/41 X |
| 3,733,475 | 5/1973 | Haeusler et al. | 364/703 |
| 3,835,396 | 9/1974 | Demos et al. | 328/41 |
| 3,891,939 | 6/1975 | Bennett et al. | 331/179 X |
| 3,976,945 | 8/1976 | Cox | 328/48 X |
| 3,982,199 | 9/1976 | Green | 328/48 X |
| 4,093,989 | 6/1978 | Flink et al. | 364/485 |
| 4,308,585 | 12/1981 | Jordan | 364/179 X |

Primary Examiner—Joseph F. Ruggiero
Attorney, Agent, or Firm—George T. Noe

[57] ABSTRACT

A digital time base for producing sample clock pulses is provided with a control circuit to permit coherent switching from one sample rate to another. A plurality of predetermined sampling rates and number of samples to be acquired at each rate are stored in a memory. The predetermined sampling rates provide count moduli to a counter which divides the frequency of a base clock in accordance therewith to produce the actual sample clock pulses. A counter is provided to count the sample clock pulses, and when the desired number of pulses are generated, a next succeeding sampling rate and number of samples to be acquired are accessed from the memory. The rate switching to change the count modulus takes place between last sample clock pulse generated for a particular sampling rate and the next succeeding base clock pulse so that such switching is coherent.

8 Claims, 3 Drawing Figures

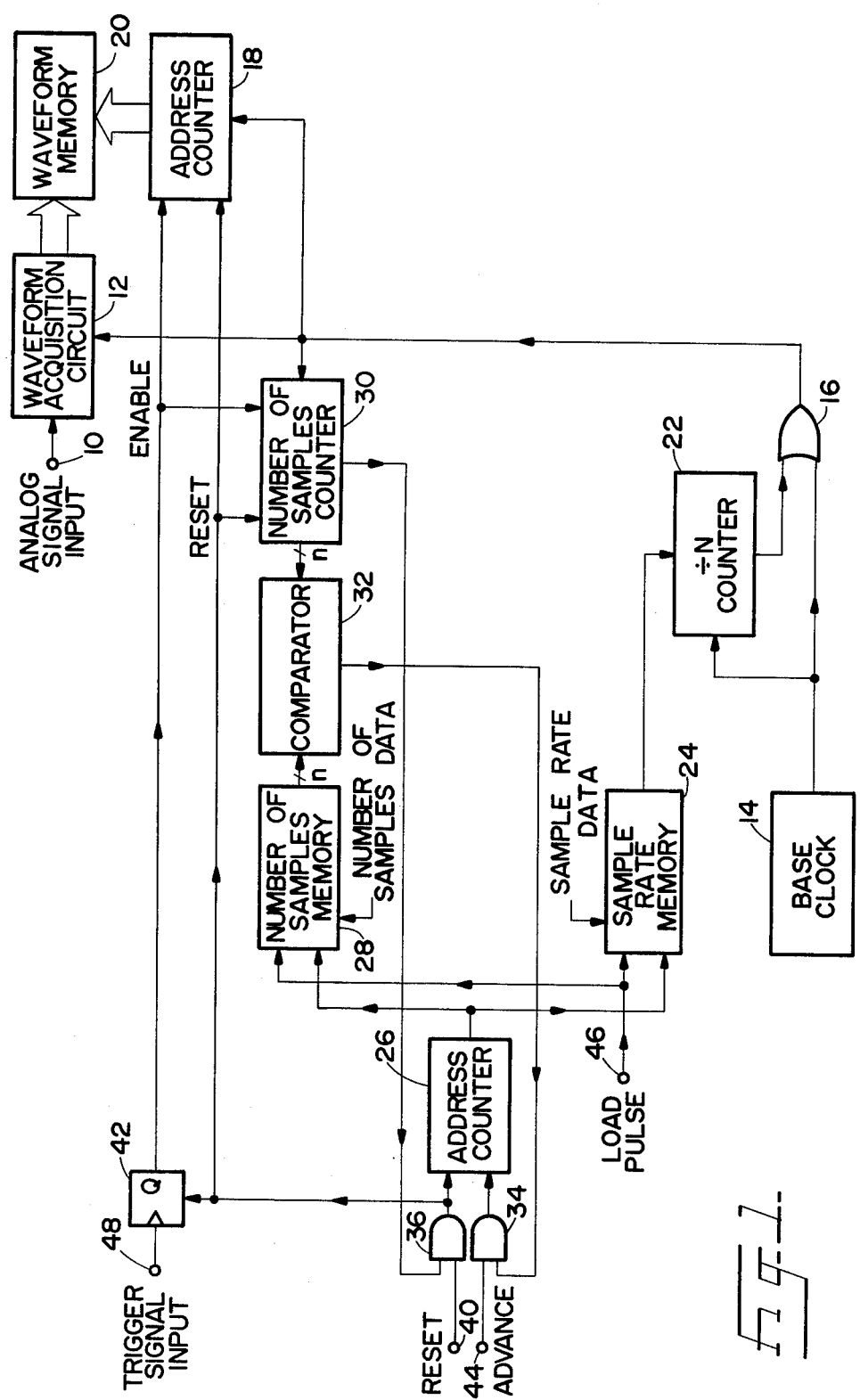

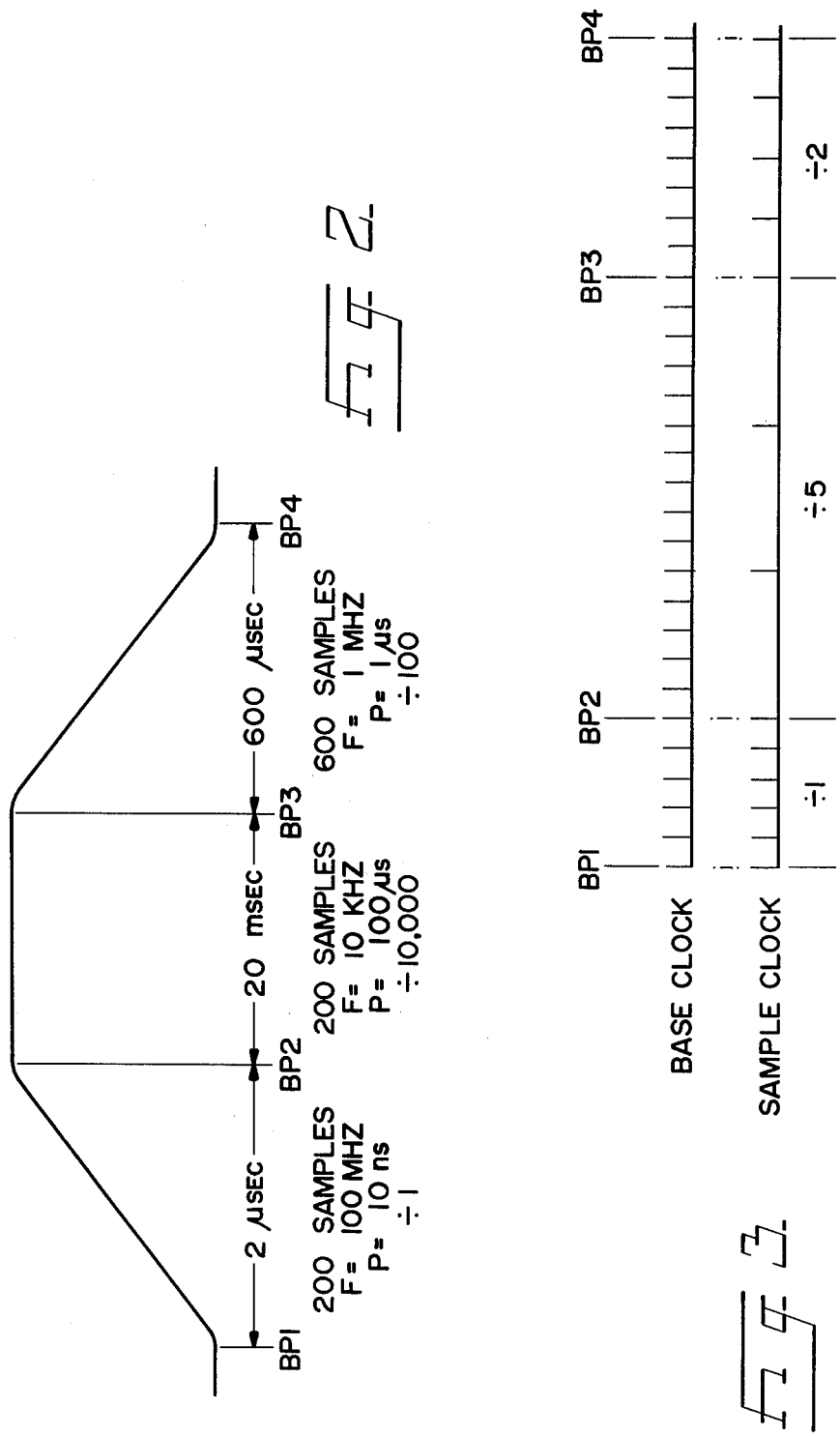

DIGITAL TIME BASE WITH COHERENT RATE SWITCHING

This is a continuation of application Ser. No. 124,173, filed Feb. 25, 1980 and now abandoned.

BACKGROUND OF THE INVENTION

The present invention relates to sampling clock circuits in general, and in particular to a sampling clock control circuit to provide coherent switching between sampling clock rates.

In electronic instruments such as digital processing oscilloscopes and transient digitizing oscilloscopes, high speed analog electrical pulses are converted to digital representations to facilitate storage, analysis, and display. Generally, the conversion to digital representations is accomplished by sampling the analog pulses at a fixed rate and then quantizing the samples by means of an analog-to-digital converter. A sampling clock having a plurality of selectable clock rates may be provided to operate the sampling circuit at different rates for input signals having different frequencies or transition times. This permits faster signals to be sampled at a faster rate, and slower signals at a proportionately slower rate so that a maximum of information may be obtained from the analog signal without exceeding available memory space. However, for wide pulses, where the data changes at high rates on the leading and falling edges and changes very little, if at all, over the flat portions of the pulses, it has heretofore been necessary to operate the sampling clock at the highest expected rate in order to acquire the entire waveform. This results in inefficient use of sampling circuits and memory space for the flat portions of the pulses.

In particular, for radar pulse analysis, it would be desirable to divide the waveform into precise time intervals and sample the data during each interval at a rate commensurate with the expected rate of change of data within each interval. However, switching between clock rates has heretofore been incoherent, which would result in unpredictable time relationships between samples acquired at different rates and thus yield a stored and displayable waveform of arbitrary time dimensions.

SUMMARY OF THE INVENTION

In accordance with the present invention, a digital time base capable of coherently switching from one clock rate to another is provided for generating sampling clock pulses.

Because the timing characteristics and general shape of certain waveforms or pulses to be acquired are known, the waveform may be divided into predetermined intervals, and for each interval a sampling rate may be selected commensurate with the expected rate of change of the waveform within the interval. With both the time intervals and the sampling rates known, the number of samples to be taken during each interval may also be determined, taking into account the fact that the total number of samples taken along the entire waveform is limited by the maximum available waveform memory space.

The digital time base sampling clock comprises a base clock which operates at a predetermined fixed frequency, a synchronous counter string which divides the base clock rate in accordance with predetermined sampling rates, and a clock gate which passes a sampling clock output pulse only upon coincidence of a counter output pulse and a base clock pulse.

The predetermined sampling rates and corresponding numbers of samples are stored in a memory. A counter counts sampling clock output pulses, and when the number of counted pulses matches the stored number for a particular sampling rate, the next sampling rate and its corresponding number of samples are selected. This selection is substantially contemporaneous with the last sampling clock output pulse, so that the synchronous counter string and pulse counter are conditioned by the new information before arrival of the next base clock pulse. Therefore, switching from one sampling rate to another during the course of waveform acquisition is coherent because no unpredictable or unknown time gaps appear between sampling clock pulses.

It is therefore one object of the present invention to provide a digital time base with coherent rate switching.

It is another object to provide a sampling clock that is capable of coherently switching from one sampling rate to another during the course of waveform acquisition.

It is a further object to make more efficient use of waveform memory space by sampling at rates commensurate with expected rates of change of the waveform.

It is an additional object to provide a digital time base for a waveform acquisition system in which sampling rates and numbers of samples acquired for each sampling rate are programmable.

Other objects and advantages will become apparent to those having ordinary skill in the art upon a reading of the following description when taken in conjunction with the accompanying drawings.

BRIEF DESCRIPTION OF THE DRAWINGS

FIG. 1 is a block diagram of a digital timebase in accordance with the present invention;

FIG. 2 is a compacted idealized waveform of an analog signal to be digitized at different rates; and FIG. 3 is a timing diagram illustrating coherent rate switching.

DETAILED DESCRIPTION OF THE INVENTION

Referring now to FIG. 1, there is shown a block diagram of a time base for an acquisition system in which analog signals are applied via an input terminal 10 to a waveform acquisition circuit 12, which may suitably include well-known sample-and-hold and analog-to-digital converter circuits utilized by conventional digital oscilloscopes. The acquisition circuit 12 samples the input waveform in accordance with sample clock pulses provided by a base clock 14 and a sample clock gate 16 in the digital time base circuit. An address counter 18 is advanced by the sampling clock pulses and provides address signals for storing digital representations of analog samples in a waveform memory 20.

While waveform memory systems require both acquisition and readout circuitry, the present invention is concerned only with the acquisition cycle, and, therefore, the readout circuitry is omitted to clarify the description. It is presumed that readout for display purposes is within the purview of those having ordinary skill in the art and may be implemented using conventional techniques.

A time base control circuit includes a ÷N counter 22, which divides the base clock rate by a preset count modulus value from a sample-rate memory 24. The base clock 14 may suitably be a crystal-controlled oscillator which produces clock pulses at a fixed frequency, for example, 100 megahertz. The ÷N counter 22 may be any of a number of commercially-available counters which count down a presettable number of clock pulses and produce a terminal count output at the end of each countdown cycle. In this particular embodiment, a synchronous string of counters is employed to provide a variable-modulus counter which is capable of dividing the clock signal from one to 10,000 in steps of $N = A \times 10^B$, where $1 \leq A \leq 10$ and $0 \leq B \leq 3$, A and B both are integers. The sample rate memory 24 may suitably by a random-access memory (RAM) operated as a first-in-first-out (FIFO) device controlled by an address counter 26. The address counter 26 also controls a number-of-samples memory 28, which also may suitably be a RAM operated as a FIFO device. A number-of-samples counter counts clock pulses from the sample clock gate 16. A digital comparator 32 compares the count output of counter 30 with the contents of the addressed section of memory 28, and when there is a match, the comparator issues a signal which is applied via an advance gate 34 to the address counter 26, which advances one count and selects the next sample rate or count modulus in memory 24 and the next number of samples in memory 28. When the terminal count of counter 30 is reached, such counter issues a signal which is applied via a reset gate 36 to reset the system.

Operation of the overall acquisition system may best be understood in terms of an example. FIG. 2 shows a compacted idealized waveform of an analog pulse to be digitized. The characteristics of this waveform have been chosen to illustrate a wide pulse having comparatively fast leading and falling edges. Suppose that this waveform is to be applied to input terminal 10, and suppose further that the available memory space of waveform memory 20 is 1000 storage locations, and that the clock rate of base clock 14 is 100 megahertz. The waveform of FIG. 2 may be broken into three segments having respective durations of 2 microseconds, 20 milliseconds, and 600 microseconds. These three segments are defined by breakpoints BP1, BP2, BP3, and BP4. Segment BP1-BP2 is to be sampled at a 100 megahertz rate, and 200 samples are to be taken. Segment BP2-BP3 is to be sampled at a 10 kilohertz rate, and 200 samples are to be taken. Segment BP3-BP4 is to be sampled at a one megahertz rate, and 600 samples are to be taken. This will provide 1000 samples to completely fill the memory 20 and also provide complete information relative to the waveform. It is assumed for this discussion that BP1 is the trigger point. The first step is to load the predetermined data relating to the sample rates and numbers of samples for each rate into the time base control system.

Initially, the system is reset. This is accomplished by applying a logical low voltage to one input of the reset gate 36, which is an AND gate, via an input terminal 40. The other input, which is the terminal count output of counter 30, has a logical high voltage applied thereto. The output of reset gate 36 goes low, resetting the address counter 26, the number of samples counter 30, the memory address counter 18, and a trigger flip-flop 42. After resetting the system, a logical high is applied, for example, through a pull-up resistor to a suitable supply voltage, to input terminal 40 and to the reset gate 36, allowing the output thereof to go high. Similarly, a logical high is applied via input terminal 44 to the advance gate 34, which is also an AND gate, and a logical high is also applied from the comparator 32 to the other input of advance gate 34, holding its output high.

Next, the sample-rate data and number-of-samples data, which may be in the form of predetermined data words, are loaded into respective memories 24 and 28. This is done by placing first the data relating to segment BP1-BP2 on the load lines and applying a load pulse to an input terminal 46. Then the address counter 26 is advanced one count by application of a low-going pulse at input terminal 44. Then the data relating to segment BP2-BP3 is placed on the load lines, and the process is repeated until all of the sample-rate and number-of-samples data are loaded. After the hereinabove-described loading process, the system is again reset to return the address counter 26 to its initial position. The reset pulse, in resetting the trigger flip-flop 42, disables the memory address counter 18 and number-of-samples counter until the system is activated by application of a trigger pulse at an input terminal 48. Thus, even though the time base is running at the first rate, any samples taken by the waveform acquisition circuit 12 prior to the system being triggered are just thrown away.

A trigger signal may be derived from the input analog signal in the manner employed by conventional oscilloscopes. For example, the analog signal may first be processed by a preamplifier, wherein a triggering signal is picked off and then compared with an adjustable voltage level to generate a trigger signal of any desired point on the waveform which represents the analog signal. In such a case, the analog signal is applied from the preamplifier to the waveform acquisition circuit via delay line to give the time base circuits time to be activated so as not to lose any of the analog signal. The trigger signal is applied via input terminal 48 to the clock input of flip-flop 42, allowing the Q output thereof to go high, enabling the address counter 18 and the number-of-samples counter 30. As mentioned previously, the timebase is already operating at the first rate, or 100 megahertz, since the base clock signal is divided by one. The terminal count output of counter 22 is a logic low, and the sample clock gate 16 is accordingly an OR gate which passes negative-going sample clock pulses when both of its inputs are low. The address counter 18 and number-of-samples counter 30 begin to count the sampling clock pulses, and acquired samples are stored in addressed memory locations of waveform memory 20. When the 200th sample clock pulse is counted by counter 30, the output of comparator 32 goes low, pulling the output of advance gate 34 low, advancing the address counter 26 one count, selecting in memories 24 and 28 the sample-rate data and number-of-samples data pertaining to time segment BP2-BP3. The base clock 14 has a clock period of 10 nanoseconds at 100 megahertz, and the foregoing comparator switching, address counter advance, and memory output update occurs in less than 10 nanoseconds so that the ÷N counter 22 is updated with the new rate before the next base clock pulse arrives. Thus, at breakpoint BP2, the sample clock pulse output from sample clock gate 16 is coherently switched from a one-megahertz rate to a 10-kilohertz rate, and no undetermined time gaps are present in the stored waveform.

This process repeats between BP2 and BP3, where waveform acquisition circuit 12 acquires 200 more samples, and at breakpoint BP3 the sample clock pulse output from sample clock gate 16 is coherently switched from a 10 kilohertz rate to a one megahertz rate. Between BP3 and BP4, 600 more samples are acquired, filling the memory. At breakpoint BP4, the number of samples counter 30 reaches its terminal count, producing a low output which is applied to the reset gate 36 to reset the system as described previously.

A graphic illustration of the coherent rate switching can be seen in the timing diagram of FIG. 3. Different rates from those discussed above have been chosen to facilitate an understanding of the coherent rate switching concept. Between BP1 and BP2, the base clock is divided by one, and a sample clock pulse is produced for every base clock pulse. At BP2, the rate is switched, and the base clock is divided by five, with the first sample clock pulse appearing coincident with the fifth base clock pulse following BP2. Thus, the switching is coherent because there are no undetermined or unkown time gaps in the sample clock output. At BP3, the sample clock rate is coherently switched again, and the base clock is divided by two. Note that the sample clock pulses are coincident with base clock pulses, and that the breakpoints occur on sample clock pulses.

It will therefore be appreciated that the aforementioned and other desirable objects have been achieved; however, it should be noted that the particular embodiment of the invention which is shown and described herein is intended as merely illustrative and not as restrictive of the invention.

What I claim as being novel is:

1. A digital time base for generating sample clock pulses to sample a waveform having contiguous sections which have different rates of change along a time axis, comprising:

means for storing a predetermined sampling rate for each of said waveform sections;

means for storing a predetermined number corresponding to a number of sample clock pulses to be generated for each section, each of said numbers also corresponding to a respective one of said sampling rates;

a base clock for producing base clock pulses at a predetermined frequency;

means coupled to said sample rate storage means and to said base clock for dividing the frequency of said base clock pulses in accordance with respective predetermined sampling rates to produce sample clock pulses substantially coincident with respective ones of said base clock pulses; and control means for detecting the last sample clock pulse generated for each waveform section and selecting prior to the next successive base clock pulse a next successive sample rate for the next waveform section and number of samples to be taken at said next rate to cause sample rate switching between the last base clock pulse generated for each sampling rate and the next successive base clock pulse.

2. A digital time base in accordance with claim 1 wherein said means for storing predetermined sampling rates comprises a first memory and said means for storing predetermined numbers comprises a second memory, and wherein said control means comprises a counter for counting sample clock pulses, means for generating a control signal when the number of counted sample clock pulses is equal to the selected number from said second memory, and an address counter responsive to said control signal for selecting the next successive sampling rate in said first memory and the next successive number in said second memory.

3. A digital time base in accordance with claim 1 wherein said base clock frequency dividing means comprises a counter which counts down clock pulses in accordance with a count modulus represented by said selected sampling rate to produce said sampling clock pulses.

4. A digital time base in accordance with claim 3 wherein said clock frequency dividing means further comprises a gate responsive to the contemporaneous output of said counter and base clock pulses to provide sampling clock pulses.

5. A digital time base for producing sample clock pulses at different rates with coherent switching between rates, comprising:

a base clock for producing base clock pulses at a predetermined frequency;

a variable-modulus counter for receiving said base clock pulses and dividing the frequency thereof to produce divided base clock pulses in accordance with respective ones of plurality of predetermined count moduli; and means for switching the count moduli such that such switching takes place between a last divided base clock pulse at one predetermined rate and a next succeeding undivided base clock pulse so that a next divided base clock pulse at a new selected rate occurs after a predetermined time interval.

6. A digital time base in accordance with claim 5 further comprising means for storing a plurality of predetermined count moduli and a predetermined number of divided base clock pulses to be produced.

7. A digital time base in accordance with claim 6 further comprising a counter to count the number of divided base clock pulses.

8. A digital time base in accordance with claim 7 wherein said switching means includes means for generating a switching pulse when the counted number of divided base clock pulses is equal to one of said plurality of predetermined numbers of pulses to be produced, said means for storing said predetermined count moduli and predetermined numbers of pulses being responsive to said switching pulse to provide a next successive count modulus and next successive number to be produced.

* * * * *